Nov. 8, 1966 J. MARLOW 3,284,724

OSCILLATOR WITH FEEDBACK BIAS AMPLITUDE STABILIZATION

Filed Oct. 14, 1963 2 Sheets-Sheet 1

JACOB MARLOW INVENTOR.

BY Robert L. Marlow
ATTORNEY

JACOB MARLOW INVENTOR.

BY Robert L. Marlow
ATTORNEY

United States Patent Office 3,284,724

Patented Nov. 8, 1966

3,284,724

OSCILLATOR WITH FEEDBACK BIAS AMPLITUDE STABILIZATION

Jacob Marlow, King of Prussia, Pa., assignor to Robertshaw Controls Company, Richmond, Va., a corporation of Delaware Filed Oct. 14, 1963, Ser. No. 315,865
7 Claims. (Cl. 331—109)

The invention presented herein relates to oscillators, and more particularly to controlled amplitude oscillators using transistors as the active components.

The amplitude of the output signal of an oscillator will vary with the changes in supply voltage, temperature and load. In some applications one or more of these factors may not be important or can be eliminated by external means or special compensating environment. In the case of the elimination of the supply voltage factor, a constant voltage can be required or supplied. Solutions of this type, however, place limitations on the versatility and acceptability of oscillators designed using such corrective measures. Accordingly, an object of the invention described herein is to provide an oscillator having a substantially controlled amplitude over a wide range of change in ambient temperature, supply voltage and load without the use of a regulated or specially designed power supply or the use of complex temperature compensating circuits.

Another object is to provide an oscillator of the type which produces an output signal having a substantially constant amplitude for any preset operating amplitude level.

A further object is to provide such an oscillator which employs a novel regulating circuit to obtain a constant amplitude output signal.

Still another object is to provide an oscillator wherein a regulating circuit is used to provide a controlled bias voltage which is derived in part from a constant D.C. reference voltage modified by a D.C. voltage that is proportional to the signal developed at the output of the oscillator.

A further object is to provide an oscillator in which a regulating circuit used to provide a controlled bias voltage is obtained in a manner which improves the temperature coefficient for the oscillator without the use of additional components.

Other objects and advantages of the invention will become apparent from consideration of the specification and claims taken together with the accompanying drawing.

Figure 1:
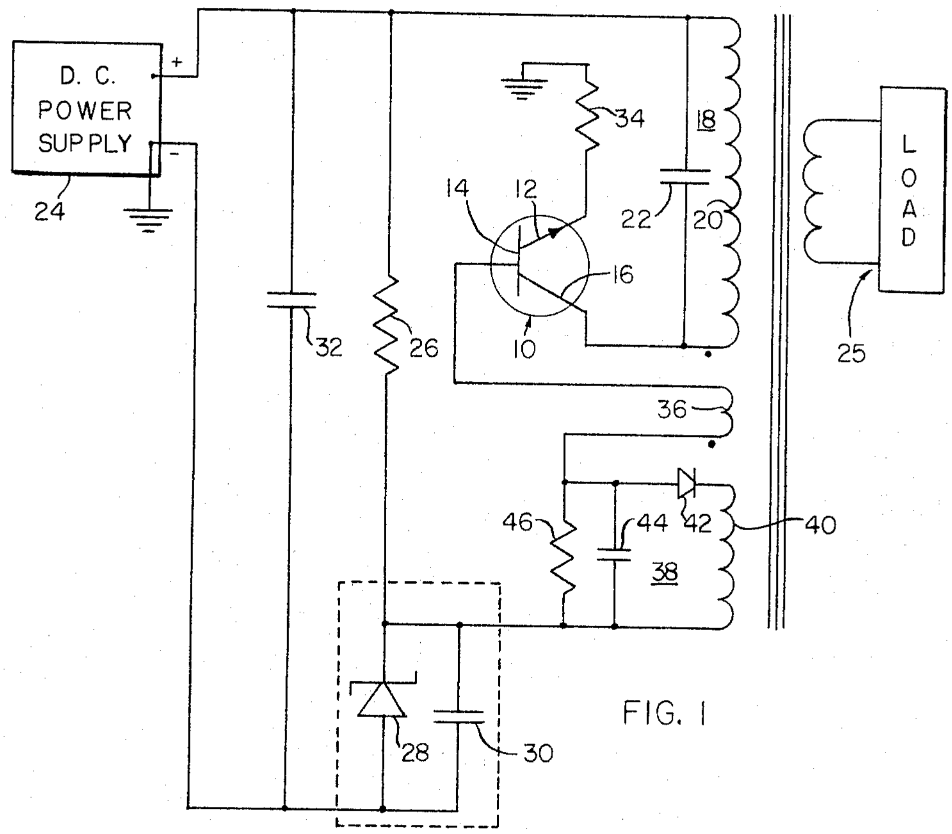
FIG. 1 is the basic circuit of the oscillator embodying the invention.

Referring to FIG. 1, there is shown an oscillator circuit embodying the invention in which a transistor 10 is connected in common-emitter configuration. The emitter, base and collector of the transistor are identified by reference numbers 12, 14 and 16, respectively. A tank circuit 18 is connected between the collector 16 and the positive side of a D.C. power supply 24. The tank circuit 18 includes an inductance winding 20 and a parallel connected capacitor 22. A load circuit 25 is inductively coupled to the winding 20 of the tank circuit 18.

A Zener diode 28 is used to provide a D.C. constant voltage source and is connected in a feedback controlled bias circuit for the base-emitter of transistor 10. The operating point for the Zener diode is determined by a resistor 26 connected in series with the Zener diode 28. The resistor 26 is connected to the positive side of the D.C. power supply 24, while the Zener diode 28 is connected to the negative side or ground of the voltage supply 26. A capacitor 30 is connected in parallel with the Zener diode to provide a high frequency signal path around the Zener diode. A capacitor 32 is also connected across the D.C. supply 24 as a by-pass for the high frequency signal.

The Zener diode 28 is part of a circuit loop including the base-emitter of transistor 10. The base-emitter circuit loop includes an emitter resistor 34, a feedback winding 36 inductively coupled to the winding 20 of tank circuit 18 and a D.C. control voltage source 38 which provides a D.C. voltage that is proportional to the voltage appearing across the tank circuit. The D.C. control voltage source 38 is connected so its voltage opposes the D.C. constant voltage presented by the Zener diode 28. The feedback winding 36 is connected to provide a regenerative or positive feedback signal to the base 14.

The D.C. control voltage source 38 forms an important part of this invention in that it contributes a great deal to the stability of the oscillator output signal. The D.C. control voltage source 38 includes a winding 40 inductively coupled to the winding 20 of the tank circuit 18 to cause a voltage to be developed across the winding 40 which is proportional to the voltage output signal supplied from the tank circuit. The voltage induced in winding 40 is rectified by a diode 42 connected in series with the winding 40. A capacitor 44 connected in parallel with a resistor 46 provides a filter which is connected across the diode 42 and winding 40 and serves to smooth out the signal rectified by the diode 42. The time constant of the filter is made sufficiently long so a ripple-free D.C. voltage is developed. The D.C. control voltage source 38 is connected so the D.C. voltage it develops is in series opposition to the voltage developed across the Zener diode 28. The D.C. control voltage, $V_c$, provided by the control voltage source 38 is equal to the peak voltage, $V_{peak}$, developed across the winding 40 less the forward drop, $V_d$, of the diode 42.

Changes in supply voltage, ambient temperature and load generally influence the amplitude of the output signal of a transistorized oscillator circuit. A more detailed consideration of the circuit just described will show how the circuit operates to minimize the effect of changes in supply voltage, ambient temperature and load.

The Zener diode 28 does not present a compensation problem since temperature compensated Zener diodes are commercially available. The value of resistor 26 is chosen to provide the operating point for the Zener diode 28 where the temperature compensation is best achieved. A temperature compensation problem is presented by the transistor 10 since the base-emitter junction forward voltage drop is temperature sensitive. Temperature compensation for transistor 10 is accomplished in the circuit just described without the use of any additional components. The diode 42 is chosen on the basis of its forward characteristic to match the forward characteristic of the base-emitter junction. This is readily accomplished by using transistor 10 and diode 42 which are made from the same semiconductor material and similar process, i.e., both may be silicon planar devices. This matching of the forward characteristics is of value since the diode 42 and base-emitter junction of transistor 10 are poled in opposite directions. Thus, the voltage dependent component of the voltage appearing across the base-emitter junction of the transistor is cancelled by the voltage developed across the diode 42 removing their influence on output temperature stability. A consideration of the voltages used to develop the feedback control bias for the base-emitter of transistor 10 to show how it provides stabilization with respect to supply voltage and load changes will also indicate how the temperature dependent influences of the diode 42 and the base-emitter junction on output are cancelled.

Figure 2:
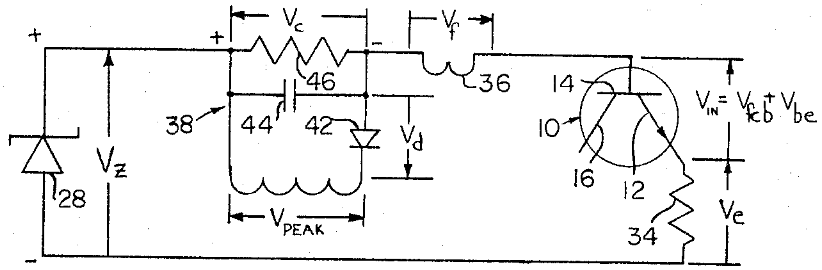
FIG. 2 shows one circuit loop of the circuit shown in FIG. 1.

The feedback control bias just referred to is the voltage applied to the base-emitter junction of transistor 10. Referring to FIG. 2, there is shown that portion of the circuit of FIG. 1 comprising the base-emitter circuit loop. The various voltages developed are identified in the drawing with the arrowhead indicating positive voltage. The voltage equation for this circuit loop with the transistor conducting is as follows:

$$V_z - V_c + V_f - V_{in} - V_e = 0$$

The instantaneous transistor input voltage, $V_{in}$, is equal to a temperature dependent component $V_{be}$ plus the voltage feed back control bias, $V_{fcb}$, and as mentioned earlier, the voltage presented by the direct current control voltage source 38 is equal to the peak voltage, $V_{peak}$, across the winding 40 minus the forward drop, $V_d$, of the diode 42. The foregoing loop equation can then be written as follows:

$$V_z - V_{peak} + V_d - V_{be} - V_{fcb} - V_e + V_f = 0$$

As mentioned earlier, the forward drop, $V_d$, of diode 42 is matched to the forward drop of the base-emitter junction of transistor 10 which accounts for the voltage $V_{be}$. Referring to the last mentioned equation, it can be seen that the voltage $V_d$ and $V_{be}$ are of opposite sign and having been matched, cancel one another. The equation for the feedback control bias, $V_{fcb}$, can be written as follows:

$$V_{fcb} = V_z - V_{peak} - V_e + V_f$$

The feedback control bias voltage, $V_{fcb}$, of course, determines the conduction angle of transistor 10 and, therefore, the output voltage. The value of the feedback control voltage $V_{fcb}$ is dependent on $V_z$, $V_{peak}$, $V_e$ and $V_f$ as shown by the last equation. $V_z$ being derived from the Zener diode 28, is constant while the remaining voltages vary with supply voltage and load. Thus, with a sudden increase in supply voltage or decrease in load, $V_e$, $V_{peak}$ and $V_f$ will increase. The feedback control bias voltage may then be expressed as follows:

$$V'_{fcb} = V_{fbc} - \Delta V_{peak} - \Delta V_e + \Delta V_f$$

The relative values of the incremental changes in $V_e$, $V_{peak}$ and $V_f$ determine the type of action that will result from a change in supply voltage or load. Since the incremental change $\Delta V_f$ tends to further increase the output signal, it is necessary that the incremental change $\Delta V_{peak}$ and $\Delta V_e$ which have the opposite effect, dominate. Such is the case, since the winding 40 is made with more turns than winding 36. The corrective action of $\Delta V_{peak}$ in relation to $\Delta V_f$ is further enhanced by the incremental change $\Delta V_e$ in the emitter resistor voltage $V_e$. In a circuit constructed in accordance with this invention, the corrective action produced by the change in $V_{peak}$ and $V_e$ was calculated to be 5.7 times the action caused by the incremental change in $V_f$. This strong reduction in the feedback control bias voltage, $V_{fcb}$, coupled with the very high gain of the common emitter circuit thus reduces the conduction angle of the transistor 10 and opposes any further increase in the output signal so that it will be maintained very close to its original value. The opposite effect takes place with a sudden decrease in the supply voltage or increase in load. The feedback control bias voltage, $V_{fcb}$, is then increased causing the transistor 10 to assume a greater angle of conduction which in turn causes the output signal to be maintained very near its original value.

It will be apparent to anyone skilled in the art that the emitter resistor 34 may be eliminated in the circuit shown in FIG. 1 and the emitter 12 connected directly to ground. The corrective action attributed to the change in the voltage across the emitter-resistor 34 when transistor 10 is conducting is then obtained by increasing the number of turns on the winding 40. In addition, the elimination of resistor 34 in the circuit of FIG. 1 will make the output voltage signal less load dependent. It will also be apparent that the feedback winding 36 could be placed in series between the emitter and ground.

Figure 3:
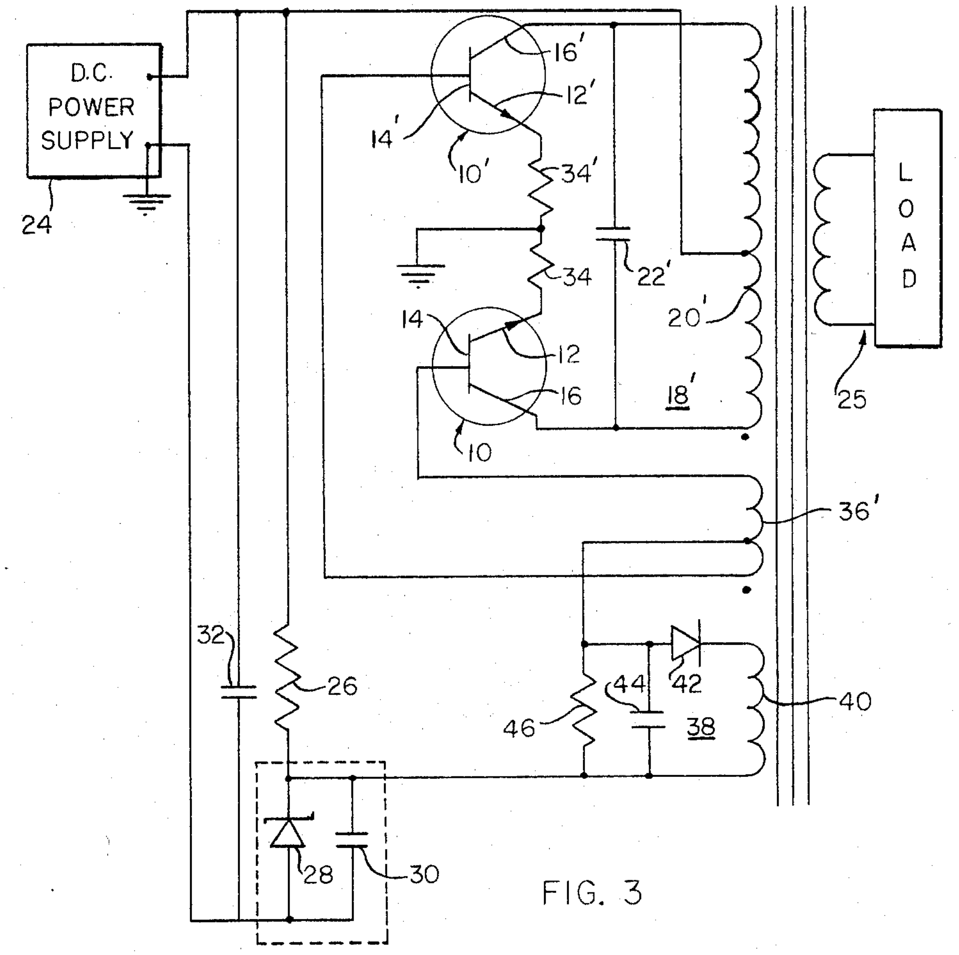
FIG. 3 is a circuit illustrating a second embodiment of the invention.

FIG. 3 shows another embodiment of the invention. FIG. 3 is the circuit of FIG. 1 with a transistor added to provide a push-pull oscillator circuit. Thus, a second transistor 10' is added having an emitter resistor 34' connected between the emitter 12' and ground. A tank circuit 18' is connected between the collector 16 of transistor 10 and the collector 16' of transistor 10' and includes a winding 20' having a center tap which connects with the positive side of the D.C. voltage power 24 and capacitor 22' connected in parallel with the winding 20'. The feedback winding for the transistors is supplied by the use of a single winding 36' having a center tap connected to the D.C. control voltage supply 38. One end of the winding 36' is connected to the base 14 of transistor 10, while the other end of winding 36' is connected to the base 14' of transistor 10'. The winding 36' is connected to the transistors so a regenerative or positive feedback signal is applied to the transistors from the winding 36'.

Considering each transistor loop separately, it is apparent that the mode of operation of the feedback control bias circuit to provide an output signal having a substantially constant amplitude over a wide range of change in ambient temperature, supply voltage and load is the same as described for the circuit shown in FIG. 1. The push-pull configuration, however, does provide higher oscillating achievement and output. In addition, the emitter resistors 34 and 34' perform a dual function. Thus, they contribute to the desired corrective action when the circuit is subjected to changes in supply voltage or load as explained in connection with the circuit of FIG. 1. In addition, the emitter resistors help stabilize the D.C. operating points to equalize the total power dissipation between both transistors.

Figure 4:
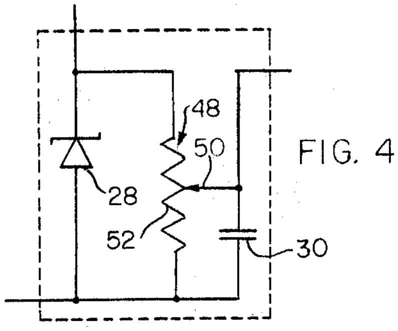
FIG. 4 shows a circuit modification applicable to the circuits shown in FIG. 1 and FIG. 2.

In the circuits shown in FIGS. 1 and 3, no provision is made to set or vary the operating points of the transistors so different levels of amplitude of the output signal can be established and held constant at such levels despite changes in the supply voltage, load or ambient temperature. FIG. 4 shows that portion of the circuits of FIGS. 1 and 3 which are modified to provide this function. The portion changed is further identified in FIGS. 1 and 3 as the portion enclosed by dotted lines. A potentiometer 48 has been added and has its resistance portion 52 connected in parallel with the Zener diode 28. The by-pass capacitor 30 is connected between the movable contact 50 of the potentiometer and ground. The movable contact 50 connects in series with the elements of the base-emitter circuit. Thus, the adjustment of the potentiometer determines the operating point for the transistors, therefore, the amplitude level of the output signal.

Other modifications of the embodiment shown and described will readily occur to those skilled in the art. Accordingly, the scope of the invention presented herein is intended to be limited only as defined in the appended claims which should be accorded a breadth of interpretation consistent with this specification.

What is claimed is:

1. An oscillator circuit energized from a D.C. power supply and providing a controlled amplitude output signal comprising:

a transistor having an emitter, base and collector;

a tank circuit connected to said collector and the D.C. power supply;

a series circuit portion connected across said base and emitter including (a) a D.C. constant voltage source derived from the D.C. power supply,
(b) a resistor, and
(c) a regenerative feedback winding inductively coupled to said tank circuit, and means connected across said resistor and responsive to the output signal of the oscillator to produce a D.C. voltage across said resistor which is continuously proportional to the output signal of the oscillator and opposes the voltage of said D.C. constant voltage source.

2. The combination of claim 1 in which the D.C. constant voltage source is adjustable whereby the amplitude of the oscillator output signal may be adjusted.

3. The combination of claim 1 wherein said series circuit portion further includes an emitter resistor.

4. The combination of claim 1 wherein said means connected across said resistor includes
(a) a series connected winding and diode with said winding inductively coupled to said tank circuit and
(b) a capacitor connected in parallel with said resistor.

5. The combination of claim 1 wherein a resistor connected in series with a Zener diode is connected across the D.C. power supply with said Zener diode connected in said series circuit portion to provide said D.C. constant voltage source derived from the D.C. power supply.

6. An oscillator circuit energized from a D.C. power supply and providing a controlled amplitude output signal comprising a transistor having an emitter, base and collector; a tank circuit connected to said collector and the power supply; a circuit portion for developing a feedback control bias for said base and emitter including said base and emitter, a D.C. constant voltage source derived from said D.C. power supply, a D.C. control voltage source, and a regenerative feedback winding connected in series; said regenerative feedback winding inductively coupled to said tank circuit; said D.C. control voltage source including a winding inductively coupled to said tank circuit, a diode connected in series with said winding and a filter circuit connected across both said winding and said diode, said winding and said diode connected in series in said feedback control bias circuit portion so the D.C. voltage developed by said D.C. control voltage source opposes said D.C. constant voltage source and is continuously proportional to the voltage developed by said tank circuit; said diode poled opposite to the base-emitter junction of said transistor; whereby the feedback control bias developed by said feedback control bias circuit is insensitive to the ambient temperature variation and is effective to control the angle of conduction of said transistor and thereby stabilize the amplitude of the oscillator output signal.

7. An oscillator circuit energized from a D.C. power supply and providing a controlled amplitude output signal comprising first and second transistors connected for push-pull operation, said transistors each having an emitter, base and collector; a tank circuit connected between the collectors of said transistors and to the D.C. power supply; a first series circuit loop developing a feedback control bias for the base and emitter of said first transistor including the base and emitter of said first transistor, a D.C. constant voltage source derived from said D.C. power supply, a D.C. control voltage source, a resistor connected to the emitter of said first transistor and a regenerative feedback winding connected in series; said regenerative feedback winding inductively coupled to said tank circuit; said D.C. control voltage source providing a D.C. voltage which is continuously proportional to the output signal of the oscillator and connected in said first series circuit loop to oppose the voltage of said D.C. constant voltage source; and a second series circuit loop developing a feedback control bias for the base and emitter of said second transistor including the base and emitter of said second transistor, said D.C. constant voltage source, said D.C. control voltage source, a resistor connected to the emitter of said second transistor and a regenerative feedback winding connected in series, said last mentioned regenerative feedback winding inductively coupled to said tank circuit; said D.C. control voltage source connected in said second series circuit loop to oppose the voltage of said D.C. constant voltage source; whereby the angle of conduction of said first and second transistors is controlled by the feedback control bias developed by said first and second circuit loop, respectively, thereby to stabilize the amplitude of the oscillator output signal.

References Cited by the Examiner

UNITED STATES PATENTS

| | | | |
|---|---|---|---|
| 2,791,739 | 5/1957 | Light | 331—112 X |
| 2,896,170 | 7/1959 | Grewe | 331—117 |
| 2,919,416 | 12/1959 | Jones | 331—117 X |
| 2,968,738 | 1/1961 | Pintell. | |
| 3,061,797 | 10/1962 | Grenier | 331—109 X |
| 3,135,909 | 6/1964 | Anderson et al. | 331—109 X |

ROY LAKE, *Primary Examiner.*

S. H. GRIMM, *Assistant Examiner.*